United States Patent
Su et al.

(10) Patent No.: US 9,932,670 B2
(45) Date of Patent: Apr. 3, 2018

(54) METHOD OF DECONTAMINATION OF PROCESS CHAMBER AFTER IN-SITU CHAMBER CLEAN

(71) Applicant: Applied Materials, Inc., Santa Clara, CA (US)

(72) Inventors: Jie Su, Santa Clara, CA (US); Lori D. Washington, Union City, CA (US); Sandeep Nijhawan, Los Altos, CA (US); Olga Kryliouk, Sunnyvale, CA (US); Jacob Grayson, Midland, MI (US); Sang Won Kang, San Jose, CA (US); Dong Hyung Lee, Yongin-Si (KR); Hua Chung, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 954 days.

(21) Appl. No.: 14/149,526

(22) Filed: Jan. 7, 2014

(65) Prior Publication Data

US 2014/0116470 A1    May 1, 2014

Related U.S. Application Data

(63) Continuation of application No. 12/868,899, filed on Aug. 26, 2010, now abandoned.
(Continued)

(51) Int. Cl.
*B08B 9/00* (2006.01)
*B08B 5/00* (2006.01)
(Continued)

(52) U.S. Cl.
CPC ...... *C23C 16/4405* (2013.01); *C23C 16/4404* (2013.01); *C23C 16/45574* (2013.01); *H01L 21/67115* (2013.01)

(58) Field of Classification Search
CPC ............ C23C 16/4405; C23C 16/4404; C23C 16/45574; H01L 21/67115
See application file for complete search history.

(56) References Cited

U.S. PATENT DOCUMENTS

| 4,592,306 A | 6/1986 | Gallego |
| 4,763,602 A | 8/1988 | Madan et al. |

(Continued)

FOREIGN PATENT DOCUMENTS

| EP | 0541373 A2 | 5/1993 |
| EP | 2055397 A2 | 5/2009 |

(Continued)

OTHER PUBLICATIONS

Machine translation of JP2006-332201A dated Dec. 2006.*
(Continued)

*Primary Examiner* — Douglas Lee
(74) *Attorney, Agent, or Firm* — Patterson + Sheridan LLP

(57) ABSTRACT

A method and apparatus for removing deposition products from internal surfaces of a processing chamber, and for preventing or slowing growth of such deposition products. A halogen containing gas is provided to the chamber to etch away deposition products. A halogen scavenging gas is provided to the chamber to remove any residual halogen. The halogen scavenging gas is generally activated by exposure to electromagnetic energy, either inside the processing chamber by thermal energy, or in a remote chamber by electric field, UV, or microwave. A deposition precursor may be added to the halogen scavenging gas to form a deposition resistant film on the internal surfaces of the chamber. Additionally, or alternately, a deposition resistant film may be
(Continued)

formed by sputtering a deposition resistant metal onto internal components of the processing chamber in a PVD process.

7 Claims, 6 Drawing Sheets

Related U.S. Application Data

(60) Provisional application No. 61/237,505, filed on Aug. 27, 2009.

(51) Int. Cl.
  *C23C 16/44* (2006.01)
  *C23C 16/455* (2006.01)
  *H01L 21/67* (2006.01)

(56) References Cited

U.S. PATENT DOCUMENTS

| | | | |
|---|---|---|---|
| 5,376,580 A | | 12/1994 | Kish et al. |
| 5,686,738 A | | 11/1997 | Moustakas |
| 6,176,936 B1 | | 1/2001 | Taguwa |
| 6,475,277 B1 | * | 11/2002 | Hirota .................. C30B 25/105 117/106 |
| 6,551,848 B2 | | 4/2003 | Kwak et al. |
| 6,692,568 B2 | | 2/2004 | Cuomo et al. |
| 7,204,913 B1 | * | 4/2007 | Singh .................. C23C 16/4404 118/724 |
| 7,368,368 B2 | | 5/2008 | Emerson |
| 7,611,915 B2 | | 11/2009 | Slater, Jr. et al. |
| 7,838,315 B2 | | 11/2010 | Yang et al. |
| 2001/0035127 A1 | | 11/2001 | Metzner et al. |
| 2002/0086153 A1 | | 7/2002 | O'Donnell et al. |
| 2003/0098039 A1 | * | 5/2003 | Cheong .................. B08B 7/00 134/1.1 |
| 2004/0002221 A1 | | 1/2004 | O'Donnell et al. |
| 2004/0129671 A1 | | 7/2004 | Ji et al. |
| 2004/0231706 A1 | | 11/2004 | Bhatnagar et al. |
| 2005/0139578 A1 | | 6/2005 | Fukuda et al. |
| 2006/0125099 A1 | * | 6/2006 | Gordon .................. C07F 11/005 257/751 |
| 2006/0174815 A1 | | 8/2006 | Butcher et al. |
| 2006/0213539 A1 | * | 9/2006 | Hasebe .................. C23C 16/4408 134/22.1 |
| 2007/0148920 A1 | * | 6/2007 | Kasai .................... C23C 16/303 438/478 |
| 2008/0003362 A1 | * | 1/2008 | Nodera .................. C23C 16/4404 427/255.28 |
| 2008/0272463 A1 | | 11/2008 | Butcher et al. |
| 2008/0282978 A1 | | 11/2008 | Butcher et al. |
| 2009/0020768 A1 | | 1/2009 | Butcher et al. |
| 2009/0095221 A1 | | 4/2009 | Tam et al. |
| 2009/0095222 A1 | | 4/2009 | Tam et al. |
| 2010/0139554 A1 | | 6/2010 | Farnia et al. |
| 2010/0210067 A1 | | 8/2010 | Butcher |
| 2010/0273291 A1 | | 10/2010 | Kryliouk et al. |

FOREIGN PATENT DOCUMENTS

| | | |
|---|---|---|
| JP | 2006332201 A * | 12/2006 |
| KR | 2004-0058819 A | 7/2004 |

OTHER PUBLICATIONS

Borland, John O. "Silicon Epitaxial Equipment and Processing Advances for Bipolar Base Technology", Advance Silicon Deposition, IEEE 1992 Bipolar Circuits and Technology Meeting 1.1. p. 16-21.

Hendriks, M. "Interface Engineering in Silicon Semiconductor Processing Using a Vacuum Cluster Tool", Microelectronic Engineering 25 (1994) 185-200.

International Search Report and Written Opinion of the International Searching Authority dated Mar. 29, 2011 in PCT/US2010/046789.

PCT International Search Report for Application No. PCT/US2010/047009, dated Mar. 30, 2011.

Shealy, J.R., "Characterization of AlGaAs/GaAs Heterostructures Grown in a Multichamber OMVPE Apparatus", Journal of Crystal Growth 87 (1988) 350-356.

* cited by examiner

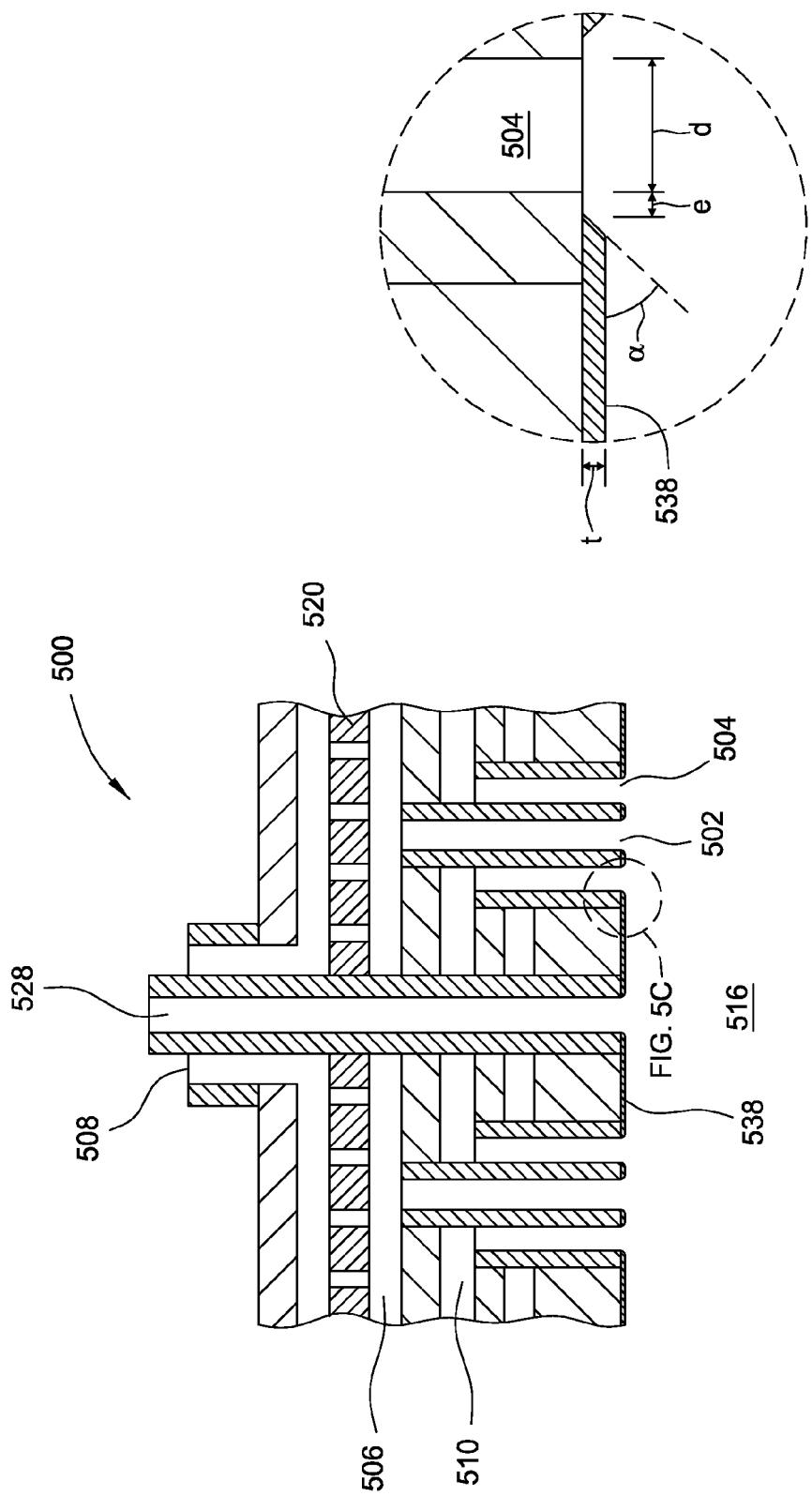

METHOD OF DECONTAMINATION OF PROCESS CHAMBER AFTER IN-SITU CHAMBER CLEAN

CROSS-REFERENCE TO RELATED APPLICATIONS

This application is a continuation of co-pending U.S. patent application Ser. No. 12/868,899, filed Aug. 26, 2010, which claims benefit of U.S. provisional patent application Ser. No. 61/237,505, filed Aug. 27, 2009. Each of the aforementioned related patent applications is herein incorporated by reference.

FIELD

Embodiments described herein generally relate to manufacture of devices such as light emitting diodes, and to processes for forming group III/V materials for such devices. More specifically, embodiments described herein relate to methods and apparatus for preventing contamination from particles or chemical residue dislodged from internal surfaces of a deposition chamber.

BACKGROUND

Group III-V films are finding greater importance in the development and fabrication of a variety of semiconductor devices, such as short wavelength light emitting diodes (LEDs), laser diodes (LDs), and electronic devices including high power, high frequency, high temperature transistors and integrated circuits. For example, short wavelength (e.g., blue/green to ultraviolet) LEDs are fabricated using the Group III-nitride semiconducting material gallium nitride (GaN). It has been observed that short wavelength LEDs fabricated using GaN can provide significantly greater efficiencies and longer operating lifetimes than short wavelength LEDs fabricated using non-nitride semiconducting materials, such as Group II-VI materials.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the film depends in part upon deposition uniformity which, in turn, depends upon uniform mixing of the precursors across the substrate.

To accomplish deposition of the layer on substrates, multiple substrates may be arranged on a substrate carrier and each substrate may have a diameter ranging from 50 mm to 100 mm or larger. The uniform mixing of precursors over larger substrates and/or more substrates and larger deposition areas is desirable in order to increase yield and throughput. These factors are important since they directly affect the cost to produce an electronic device and, thus, a device manufacturer's competitiveness in the market place.

The different gases, which when combined react to form the deposition layer, are generally provided through different pathways in a gas distributor to the reaction chamber. As the gases exit the gas distributor, they mix and begin reacting. Generally, the gas distributor is kept at a temperature well below the substrate temperature to avoid decomposition of gases in the precursor pathways before the precursor gases reach the substrate. Although most reaction products are formed near the heated substrate, some begin forming as the precursors mix near the exit of the gas distributor, and condense and deposit on the gas distributor. The deposits build up over many deposition cycles, until there is an unacceptable risk that particles formed from this unwanted deposition will dislodge during deposition and contaminate substrates being processed in the chamber. Thus, there is a need for methods and apparatus to prevent or retard buildup of such deposits.

SUMMARY

Embodiments disclosed herein provide a method of cleaning group III nitride deposits formed on a gas distributor during a processing run in a deposition chamber, the method comprising forming a sacrificial coating on the gas distributor prior to the processing run, after the processing run, exposing the group III nitride deposits and the sacrificial coating to an activated halogen containing gas, and etching the sacrificial coating and the group III nitride deposits, wherein the sacrificial coating is etched faster than the group III nitride deposits.

Other embodiments provide a method of removing group III nitride deposits from a gas distributor in a process chamber, comprising exposing the gas distributor to a halogen containing gas, reacting the halogen containing gas with the group III nitride deposits to form volatile species, and exposing the gas distributor to an active nitrogen containing gas.

Other embodiments provide a method of operating a deposition chamber having a gas distributor with a surface exposed to the processing environment, the method comprising forming a sacrificial coating on the surface of the gas distributor, depositing a group III nitride material on a substrate in the deposition chamber and on the coated surface of the gas distributor by providing a group III metal precursor and a nitrogen containing precursor to the deposition chamber, purging the group III metal precursor from the deposition chamber using the nitrogen containing precursor, providing a halogen containing gas to the deposition chamber, activating the halogen containing gas by heating the halogen containing gas to a temperature above about 600° C., reacting the active halogen containing gas with the sacrificial layer and with the group III nitride deposits on the sacrificial coating at a pressure between about 100 Torr and about 200 Torr to remove the sacrificial coating and convert the group III nitride deposits to group III halide deposits, removing the group III halide deposits by increasing the temperature to at least about 1,000° C. and reducing the pressure to less than about 50 Torr, and heat-soaking the gas distributor at a temperature above about 1,000° C. under an inert atmosphere.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 5B and 5C are close-up views of portions of the gas distributor of FIG. 5A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
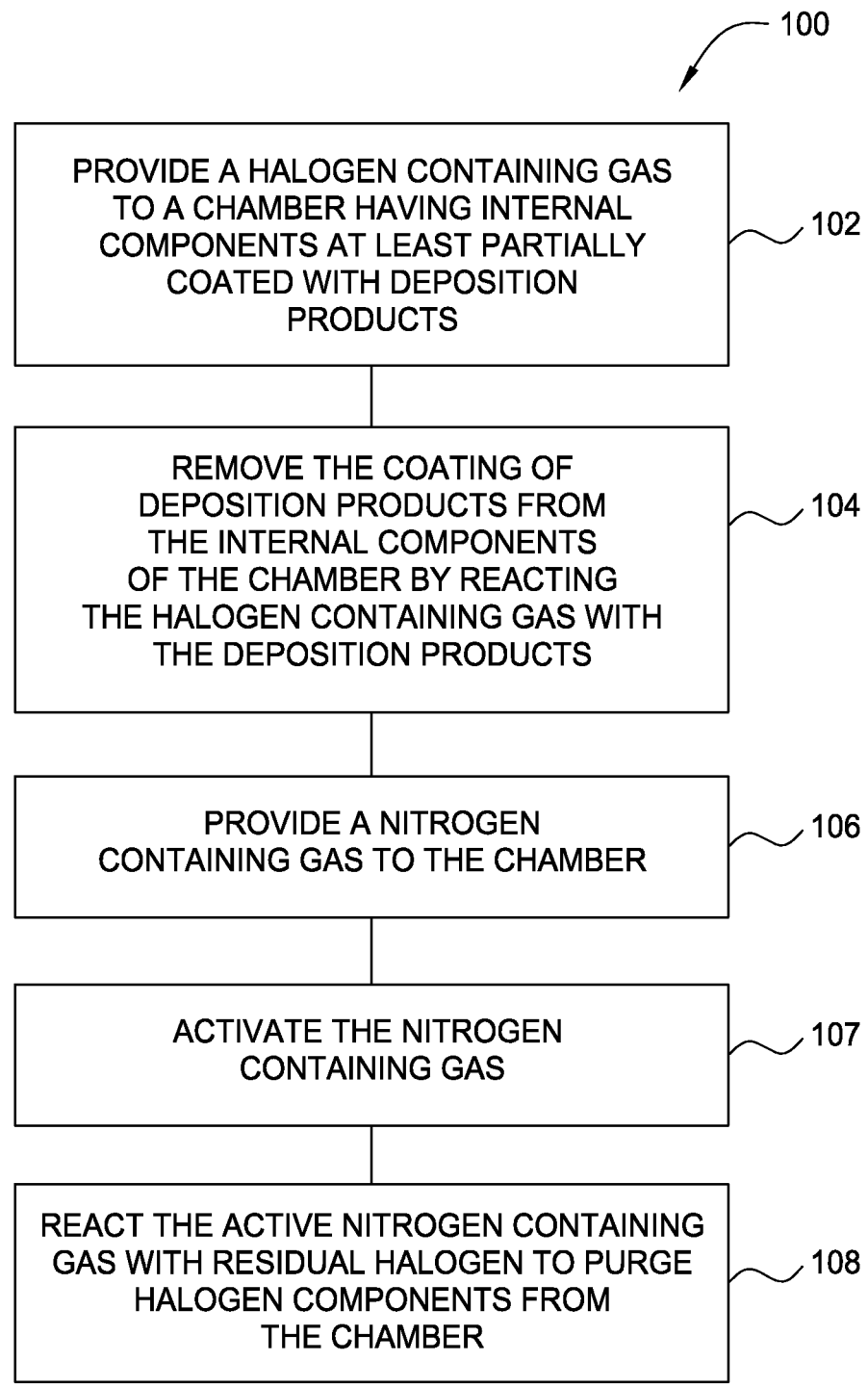
FIG. 1 is a flow diagram summarizing a method for cleaning a chamber according to one embodiment.

Embodiments disclosed herein generally provide methods and apparatus for preventing buildup of deposits on components of a deposition chamber. Some embodiments provide methods for cleaning the chamber components periodically, and other embodiments provide methods for reducing or preventing deposits. In some embodiments, a coating is applied in situ to a gas distributor to reduce formation of deposits on the gas distributor around gas flow portals. In other embodiments, the gas distributor is cleaned using active reagents, such as radicals. Such cleaning processes may follow a halogen cleaning process, and may precede a coating process.

During an MOCVD or HVPE deposition process, for example, group III materials may deposit on the gas distributor due to low vapor pressure of the reaction products produced in the chamber. This buildup of deposition products on the gas distributor and/or other chamber components, such as the chamber walls, may result in unwanted particles flaking therefrom and depositing on a substrate disposed in the chamber. Some embodiments described below provide an apparatus for forming a metal nitride layer on a substrate, comprising a chamber enclosing a substrate support and, facing the substrate support, a gas distributor having a deposition resistant coating. The deposition resistant coating will generally reduce deposition on the gas distributor, reducing the frequency of cleaning needed. The coating may be a gallium deposition-resistant coating, such as tungsten, chromium, molybdenum, or another coating resistant to deposition thereon, such as silicon carbide, silicon nitride, gallium nitride, or aluminum nitride. In some embodiment, it is also useful to use a deposition resistant coating in combination with one or more chamber component cooling devices to further inhibit the deposition of the group III materials on the exposed surfaces. In one example, the one or more chamber component cooling devices include the thermal control channel 422 and heat exchanging system 424 used to control the temperature of the gas distributor 400, which are further described below.

In one embodiment, a gas distributor resistant to deposition in a process chamber may be formed by depositing a metal coating, such as tungsten, chromium, or molybdenum on an outer surface of a gas distributor using a physical vapor deposition process, or by depositing a metal or ceramic coating, such as tungsten, chromium, molybdenum, silicon carbide, silicon nitride, gallium nitride, or aluminum nitride on the outer surface of the gas distributor using a chemical vapor deposition process. In some embodiments, a coating may be formed in-situ by providing CVD precursors such as TMG, TMA, silane, TMS, ammonia, and/or methane to a chamber having a gas distributor to be coated. In some embodiments, the coating forms a seasoning layer on the gas distributor. Exemplary CVD coatings formed from such precursors include gallium nitride, aluminum nitride, silicon nitride, and silicon carbide.

Deposits that build up during deposition may be removed by one or more cleaning processes. In one embodiment, a halogen containing gas is provided to the chamber through the gas distributor having deposits to be removed. The halogen gas reacts with the deposits, which generally contain metal-rich group III/V deposition products such as gallium (Ga), indium (In), aluminum (Al), gallium nitride (GaN), indium nitride (InN), aluminum nitride (AlN), and combinations thereof, producing halid solids and nitrogen containing gases which are removed from the chamber, the halide solids being removed from the chamber by volatilizing at high temperature. In another embodiment, halide residues that may be left by a halogen cleaning process are removed by providing active species to the chamber. In some cases the active species are formed by applying electrical energy (e.g., generating RF plasma), optical energy, or thermal energy to the gas or vapor species. The active species scavenge any remaining deposits, including halide residues. In some embodiments, the two cleaning processes are combined in a two-stage cleaning process, while in others the two cleaning steps may be performed at different times. Additionally, cleaning processes may be combined with coating processes in some embodiments.

Cleaning Methods

FIG. 1 is a flow diagram summarizing a cleaning method 100 according to one embodiment. At 102, a cleaning gas, such as a halogen containing gas, is provided to a chamber having a coating of deposition products, such as metal-rich group III nitrides or other group III/V reaction products, such as group III metals, on internal components thereof, such as on the gas distributor. Some exemplary group III deposition products that may be removed by the cleaning method 100 include Ga, In, Al, GaN, InN, AlN, aluminum gallium nitride (AlGaN), indium gallium nitride (InGaN) and the like. The coating may be continuous or discontinuous, and may be merely deposits from the deposition process formed on gas flow portals of a gas distributor. The halogen containing gas may be an elemental halogen gas, such as chlorine, fluorine, bromine, or iodine gas, or a hydrogen halide gas, or any mixture thereof. In some examples, the cleaning gas comprises a chlorine ($Cl_2$) gas, a fluorine ($F_2$) gas, a hydrogen iodide (HI) gas, an iodine chloride (ICl) gas, an HCl gas, an HBr gas, a HF gas, a $BCl_3$ gas, a $CH_3Cl$ gas, a $CCl_4$ gas and/or an $NF_3$ gas.

In one embodiment, to clean a gas distributor having deposits thereon as described above, chlorine gas ($Cl_2$) is provided to a chamber containing the gas distributor, optionally with a non-reactive carrier gas, such as argon, helium, or nitrogen gas. The chlorine gas is heated to a temperature of at least about 600° C., such as between about 650° C. and about 750° C., by heating an internal surface of the chamber, such as a substrate support disposed in the chamber facing the gas distributor. The resulting gas mixture may be about 5-100% chlorine gas in carrier gas, by total gas volume, such as between about 50% and about 80% chlorine gas in carrier gas. The chamber pressure is maintained between about 100 Torr and about 200 Torr during exposure of the gas distributor surfaces to the chlorine gas. The chlorine gas converts the group III nitrides on the gas distributor surfaces to group III halide solids.

At 104, the coating of deposition products is etched away from the interior of the chamber. The halogen containing gas reacts with the deposits to form volatile metal halides, which are removed from the chamber. In embodiments featuring chlorine gas, the chlorine reacts with the metal-rich deposits to form gallium chloride ($GaCl_3$), indium chloride ($InCl_3$), and aluminum chloride ($AlCl_3$), which are volatile at low pressures. In the embodiment featuring chlorine gas as the reactant, the chlorine gas may be provided at a flow rate between about 1 slm and about 20 slm, with carrier gas flow rate between about 0 slm and about 20 slm, at pressures between about 0.01 Torr and 1,000 Torr, such as between about 100 Torr and about 200 Torr, and temperatures between about 20° C. and about 1,200° C., such as above 600° C., for example between about 650° C. and about 750° C.

The halogen gas converts the group III nitride deposits to group III halide solids. Following conversion of the group III nitrides to group III halide solids, the group III halide solids are removed by vaporization or sublimation. The chamber temperature is increased to at least about 1,000° C., such as between about 1,050° C. and about 1,200° C., for example about 1,100° C. The chamber pressure is lowered to about 50 Torr or below. The halogen gas flow may be maintained during a first phase of the removal operation, and then the halogen gas flow may be discontinued and the carrier gas flow continued during a second phase of the removal operation. During such a second phase, the chamber temperature may be further increased to at least about 1,100° C. In the embodiment described above, conversion of the group III nitride deposits to group III halide salts takes about 5-60 minutes, depending on the thickness of the coating, and removal of the group III halide solids takes at least about 10 minutes, such as between about 10 minutes and about 20 minutes, to complete.

In some embodiments, the conversion and removal may be accomplished in cycles. In one embodiment, conversion may proceed for about 1 minute and removal for between about 10 seconds and about 20 seconds in one cycle. The cycle is then repeated until the group III nitride deposits are removed, which may take between 50 and 100 cycles. In another embodiment, conversion may proceed for about 5 minutes and removal for about 1 minute, the cycle being repeated about 10 times. In each cycle, the temperature and pressure of the chamber are moved between the conversion and removal conditions described above. Cycle repetitions and conversion and removal times per cycle depend on the thickness of the group III nitride deposits on the chamber surfaces. Thicker deposits take more time and repetitions to remove.

The halogen treatment may leave halogen containing residues on chamber surfaces, so a second optional cleaning process may be performed at 106 and 108. At 106, a nitrogen containing gas is provided to the chamber, and at 107 the nitrogen containing gas is activated. At 108, the active nitrogen containing gas is allowed to react with residual halogen species in the chamber to purge the halogen species from the chamber. In some embodiments, the nitrogen containing gas, which may be ammonia ($NH_3$), nitrogen gas ($N_2$), hydrazine ($H_2N_2$) or other simple nitrogen containing compound, may be activated into ions or radicals. In one embodiment, ammonia is heated to a temperature of at least about 500° C. by heating the substrate support. The heating activates the nitrogen containing gas, causing compounds in the gas to dissociate, pyrolyze, ionize, or form radicals. In other embodiments, the nitrogen containing gas may be heated remotely and provided to the gas distributor as a hot gas. The gas distributor is generally cooled during deposition processes to avoid unwanted reactions inside and near the distributor. During some cleaning processes, cooling of the gas distributor may be discontinued to facilitate thermal activation of cleaning compounds. Heating of the substrate support may be accomplished by any convenient means, such as by disposing heat lamps proximate the substrate support. In one embodiment, heat lamps are arrayed below the substrate support. Other embodiments may feature a substrate support heated by internal means, such as resistive or hot fluid heating.

The nitrogen containing gas may be provided with a carrier gas. In one example ammonia is provided along with nitrogen gas as a carrier. The gas mixture may be between about 10% ammonia and about 80% ammonia by volume in nitrogen gas.

The activation of operation 107 may proceed by different methods. In one embodiment, the gas distributor is exposed to hot ammonia gas, heated to at least about 1,000° C., to form highly reactive radical species that scavenge the remaining halogen from the chamber. The heating may be accomplished by heating the substrate support or the gas distributor, or by heating the ammonia remotely and providing the heated gas to the chamber. In another embodiment, a nitrogen containing gas is activated in a remote chamber by applying electromagnetic energy, such as electric fields or thermal, UV, or microwave radiation. The activated nitrogen gas, containing radical species, is then provided to the chamber to remove halogen residues. The activated nitrogen species convert the remaining halogen residues back to metal nitride to prevent halogen species from being incorporated into devices subsequently formed in the chamber. The risk that the nitrides will contaminate such devices is reduced because most of the nitride deposits are removed, leaving at most a very thin coating or residue that is very unlikely to separate from the gas distributor or other chamber component. In other embodiments, the gas may be exposed to electric fields, thermal, UV, or microwave radiation in situ.

A nitrogen containing gas may be provided at a flow rate between about 1 slm and about 50 slm, at chamber pressure of between about 0.01 Torr and about 1,000 Torr. The nitrogen containing gas may be activated by heating to a temperature between about 500° C. and about 1,200° C., such as between about 900° C. and about 1,100° C., by contacting the gas with a heated substrate support spaced apart from the gas distributor, or by heating outside the chamber. At such temperatures, the thermal energy activates the nitrogen containing gas. If UV, microwave, or electrical energy is used to activate the nitrogen containing gas, the chamber temperature may be between about 20° C. and about 600° C., such as between about 100° C. and about 300° C.

Prior to the halogen gas exposure of FIG. 1, the chamber may be purged to remove gases or substances that may be incompatible with the halogen gas. Metal precursor species such as TMG, TMA, and TMI, in particular, are removed prior to feeding halogen gas to avoid unwanted reactions that may consume the halogen gas and generate further deposits. The chamber may be purged using an inert gas such as nitrogen gas or argon, or the chamber may be purged using a non-metal reagent such as ammonia. In a deposition process wherein a metal nitride is formed from a metal precursor and ammonia, flow of the metal precursor may be discontinued and the chamber purged using the ammonia gas. Alternately, the ammonia gas may be replaced with an inert gas such as nitrogen, argon, or hydrogen to purge the chamber. During the chamber purge, the chamber pressure may be cycled to enhance removal of fugitive species adhering the chamber surfaces. A throttle valve between the chamber and the vacuum pump may be opened and closed repeatedly to cycle the chamber pressure up and down a desired number of times, for example 3-5 times.

Prior to the halogen gas exposure of FIG. 1, the chamber may be subjected to a baking operation to remove metal nitride deposits from chamber surfaces such as the substrate support and chamber liner, if any. Chamber temperature is increased to at least about 1,050° C. for a duration of 5-10 minutes or more. Hydrogen gas may be provided to enhance removal of deposits. The baking operation also enhances removal of deposits from the gas distributor.

Following the halogen gas clean and residual halogen removal operations of FIG. 1, the chamber may be subjected to a baking operation to enhance removal of halogen species from chamber surfaces. Chamber temperature is set to at least about 1,050° C. If a mixture of ammonia and nitrogen gas is used for residual halogen removal, the flow of ammonia may be discontinued, and the flow of nitrogen maintained during the post-clean baking operation. To aid removal of fugitive halogen species, the chamber pressure may be cycled between about 200 Torr and about 1 Torr by opening and closing the vacuum throttle valve. The post-clean baking operation may proceed for a duration of about 5-10 minutes or more. In one embodiment, flow of nitrogen gas may be replaced during the baking operation by a flow of hydrogen gas to help scavenge residual halogen species.

Coating Methods

Figure 2:
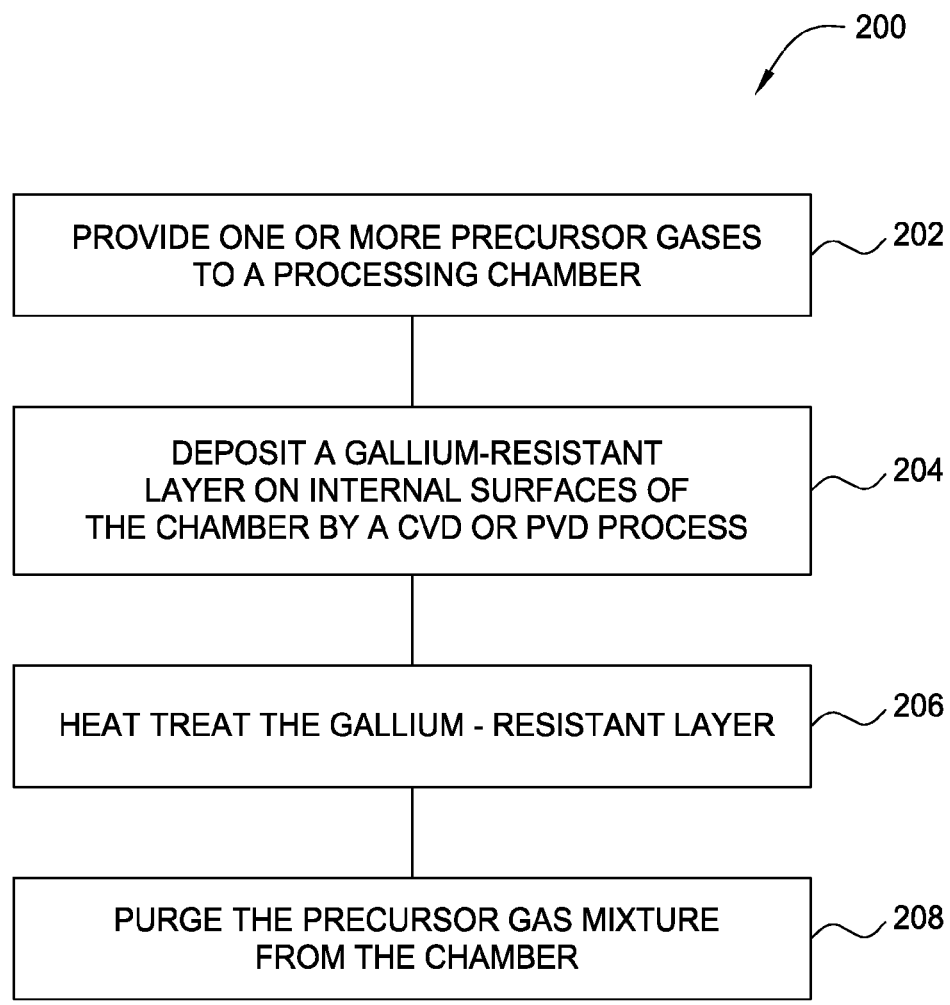
FIG. 2 is a flow diagram summarizing a method for forming a deposition resistant layer on internal surfaces of a chamber according to another embodiment.

FIG. 2 is a flow diagram summarizing a method 200, according to another embodiment, for forming a layer resistant to deposition of gallium or gallium compounds on internal surfaces of a chamber. A method such as the method 200 is useful for treating chamber components to prevent or slow deposition of gallium-rich compounds on the components of a processing chamber. In this method, one or more precursor gases are provided to a processing chamber at 202. The gases are generally selected to facilitate deposition of a layer on the internal components of the chamber. The gases may be provided through different pathways, if desired, to prevent reaction before the gases arrive in the chamber. For example, if two gases are used, a first gas may be provided to the chamber through a first pathway, and a second gas through a second pathway. A gas distributor having multiple pathways is further described in connection with FIGS. 5A and 5B.

It should be noted that the method 200 may be performed in the chamber having the internal surfaces to be coated, or components of the chamber may be placed in another processing chamber to be coated. For example, if a PVD process is performed, the chamber components may be disposed in a PVD chamber, and the process gas provided to the chamber may be a PVD process gas, such as argon or helium.

At 204, a layer is deposited on internal surfaces of the chamber. In one embodiment, two or more gases react to deposit a layer by a CVD process, which may be performed in the chamber having the internal surfaces to be coated, or in a separate chamber having components to be coated disposed therein. In one embodiment, the layer is deposited by a PVD process in which a material resistant to gallium or gallium compounds, or other group III compounds, is sputtered onto chamber components. In another embodiment, a layer is deposited by providing activated species to the chamber having the surfaces to be coated, and reacting the activated species to form the layer.

The layer may have a thickness between about 10 Å, about two unit cell dimensions of a crystal lattice, and about 1 mm. A layer or coating having a thickness of at least about two unit cell layers, such as about 10 Å, will retard growth of deposits on a gas distributor in most cases. The coating may be any thickness up to about 1 mm, but will generally be applied in a way to avoid occluding openings in the gas distributor for dispensing process gases. In one embodiment, a metal, such as tungsten, chromium, molybdenum, or a combination or alloy thereof, or another refractory metal, is sputtered onto a gas distributor to a thickness of between about 10 Å and about 1 mm, such as between about 10 Å and about 10 μm, for example between about 10 Å and about 1,000 nm. In another embodiment, TMG and ammonia are provided to a chamber containing the gas distributor to be coated thereby, depositing gallium nitride on the gas distributor. In another embodiment, TMA and ammonia are provided to the chamber to deposit aluminum nitride on the gas distributor. In another embodiment, silane and methane are provided to the chamber to deposit silicon carbide on the gas distributor. In another embodiment, silane and/or TMS and ammonia are provided to deposit silicon nitride on the gas distributor. Coatings formed by CVD processes may have thickness between about 100 nm and about 200 nm because gas flowing through the openings in the gas distributor reduces film formation in and around the openings.

In other embodiments, a refractory metal such as tungsten, chromium, molybdenum, titanium, zirconium, hafnium, vanadium, niobium, tantalum, ruthenium, osmium, rhodium, yttrium, and iridium, or ceramics (oxides) thereof, other derivatives thereof, combinations thereof, or alloys thereof, may be sputter coated or plated onto a stainless steel gas distributor according to processes such as CVD, PVD, plasma spraying, electroplating, and/or electroless plating that are known in the art. Various aluminum containing materials may also be applied by CVD or PVD, including aluminum itself, alumina, aluminum nitride, and alloys of aluminum with other metals listed above, silicon, or carbon. Other dielectric materials that may be used for coatings include boron nitride and silicon carbide. Any material that forms a tight metallurgical bond with stainless steel, such as aluminized steel, is suitable for coating a stainless steel gas distributor of an MOCVD chamber to retard or prevent buildup of deposition products.

Formation of the coating may be aided by activation of one or more chemical precursors. A precursor is generally activated by electromagnetic means, such as by exposure to an electric field, for example an RF field, to ionize a portion of the precursor, by exposure to thermal energy to dissociate, crack, or ionize the precursor, or by exposure to radiation, such as UV or microwave radiation. In some embodiments, one or more precursors may be irradiated by UV or microwave radiation, or exposed to an RF field, in an activation chamber, and the active precursors provided to the chamber containing the gas distributor to be coated. In one embodiment, the substrate support is heated to a temperature of about 600° C. to about 1,000° C. to activate one or more precursors and cause a reaction to deposit a coating on the gas distributor. In one embodiment, a first precursor is provided to the chamber at a flowrate between about 10 sccm and about 1,000 sccm, such as about 50 sccm, and a second precursor is provided at a flowrate between about 10 slm and about 300 slm, such as about 50 slm. A carrier gas, such as nitrogen gas, argon, or helium, may be provided with either the first or second precursors. As described above, the first precursor may be silane, TMS, TMG, or TMA, or another electrophillic metal or metalloid compound, or a mixture thereof. The second precursor is generally ammonia or methane, or another nucleophile.

In one embodiment, a deposition precursor and a radical precursor are provided to a processing chamber to deposit a coating on a gas distributor for an MOCVD or HVPE reactor. The deposition precursor may contain a group 13 transition metal or a metalloid, and the radical precursor may contain radicals comprising nitrogen, hydrogen, carbon, or any mixture thereof. The radicals may be generated in the processing chamber by exposing the radical precursor to electromagnetic energy such as an electric field, for example a capacitive RF field, a magnetic field, for example an inductive RF field, or electromagnetic radiation. The electromagnetic radiation may be thermal, which may be delivered by heating the gas distributor, or UV or microwave delivered by an emitter. In other embodiments, exposure to the electromagnetic energy may be performed in a separate activation chamber, and the radical precursor containing radicals may then be provided to the processing chamber containing the gas distributor to be coated. In embodiments wherein the radical precursor is activated in a separate processing chamber, deposition of a coating on the gas distributor is performed at temperatures of at least about 200° C.

The deposited layer may optionally be heat treated at 206. During the heat treatment, flow of reactive gases is generally discontinued, and components having the newly deposited layer are heated to a temperature of at least about 500° C. to cure or harden the deposited layer. Heating to high temperatures may also result in smoothing of some deposited layers, such as metals. High temperature treatment may also aid in driving away fugitive reactive species that may remain in the deposited layer.

Precursor gases may be purged from the chamber at 208 to prepare for subsequent processing. In an embodiment wherein a deposition resistant layer is deposited in situ, the precursor gases are purged from the chamber to draw fugitive reactive species out of the deposited layer, and to purge any reactive species adsorbed onto any surface of the chamber interior.

Cleaning and Seasoning

Figure 3:
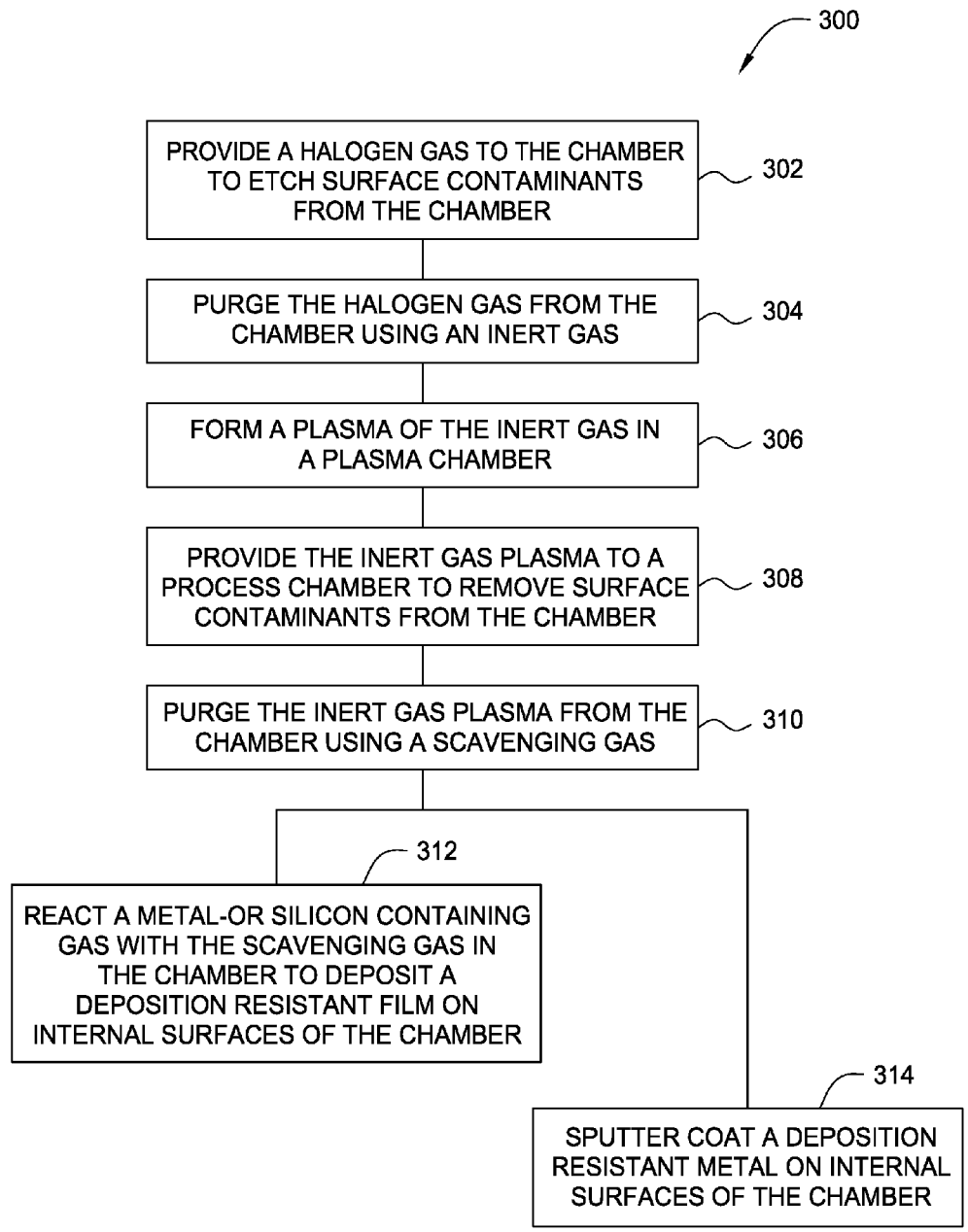
FIG. 3 is a flow diagram summarizing a method for removing unwanted deposits from, and providing a deposition resistant layer for, internal surfaces of a chamber according to another method.

FIG. 3 is a flow diagram illustrating a method 300 according to another embodiment. At 302, a cleaning gas, such as a halogen gas is provided to the chamber to etch away surface contaminants. The contaminants are generally the undesirable deposition products described earlier. In one example, the halogen gas may be an elemental halogen, such as chlorine gas ($Cl_2$) or fluorine gas ($F_2$), or a hydrogen halide gas, such as HCl or HF. The halogen species react with the surface contaminants, which are generally metal or metal nitride, to produce volatile metal halides. The chamber is maintained under vacuum to minimize halogen residues on chamber surfaces. Because some metal halides decompose at relatively low temperatures, chamber temperature may be maintained below about 200° C., such as between about 20° C. and about 200° C., for example about 100° C. Exposure to the halide species continues for between about 5 min and about 10 min.

At 304, the halogen gas is purged from the chamber using an inert gas such as argon (Ar), helium (He), or nitrogen ($N_2$). A plasma is formed from the inert gas at 306. The inert gas is provided to a plasma chamber and energized using any appropriate form of electromagnetic energy, such as electric fields (DC or RF) or electromagnetic radiation such as thermal, UV, or microwave radiation.

The inert gas plasma is provided to the process chamber at 308. The process chamber may have residual halogen species from the halogen cleaning stage 302. The inert gas plasma comprises reactive species, such as ions and radicals, that react with, soften, and etch away the contaminants. In some embodiments, a plasma pre-treatment may increase the effectiveness of a subsequent seasoning process. In one embodiment, argon, helium, or nitrogen, or any combination thereof, is activated in a plasma chamber by flowing a gas mixture comprising one or more of those components at a flow rate of about 1 slm to about 40 slm through the plasma chamber and applying electromagnetic energy to the gas in the chamber. The electromagnetic energy may take the form of an RF or DC electric field applying between about 200 Watts and about 5,000 Watts of power to the gas, or it may take the form of thermal, UV, or microwave energy at similar power levels.

At 310, the inert gas plasma is purged from the chamber using a gas that scavenges any residual halogen from chamber surfaces. Residual halogen is purged from the chamber and scavenged from chamber surfaces to avoid incorporation of halogen species in subsequent deposition processes. Examples of gases that may scavenge residual halogen from chamber surfaces are nitrogen containing gases, such as ammonia ($NH_3$), nitrogen gas ($N_2$), or hydrazine ($H_2N_2$), and hydrogen containing gases, such as simple hydrocarbons methane ($CH_4$), ethane ($C_2H_6$), ethylene ($C_2H_4$), and acetylene ($C_2H_2$), or other hydrides, such as silane ($SiH_4$) or germane ($GeH_4$).

The scavenging gas may be activated to increase reactivity. Radicals of nitrogen or hydrogen may be formed from compounds such as these by activating them using electromagnetic energy such as electric fields, for example an RF field, or electromagnetic radiation, such as thermal, UV, or microwave radiation. Thermal energy may be provided by maintaining the chamber at a temperature of about 600° C. or higher, such as between about 900° C. and about 1,100° C., for example about 1,000° C. UV or microwave radiation may be coupled into the gas in an activation chamber remote from the chamber being cleaned. Purging with the scavenging gas is generally maintained for between about 5 min and about 10 min. Prior to introducing the scavenging gas, plasma generation using the inert gas may be discontinued, and flow of the inert gas continued for a duration of between about 10 seconds and about 30 seconds to purge most of the active species and cleaning byproducts from the chamber.

A deposition resistant film may be applied to chamber components at 312 or 314. At 312, a metal or silicon containing gas such as TMG, TMA, TMI, or TMS may be added to the scavenging gas from 310 to deposit a film on internal surfaces of the chamber. A film such as silicon carbide (SiC), silicon nitride (SiN), gallium nitride (GaN), aluminum nitride (AlN), which may be p-doped or n-doped by including dopants such as boron, derived from borane or diborane, or phosphorus, derived from phosphine, or films composed of more than one such component, may be more resistant to deposition in an MOCVD or HVPE process than the clean chamber surfaces themselves. Formation of the deposition resistant film may be enhanced by maintaining activation of the scavenging gas, so that radical species from the activated scavenging gas react with the metal or silicon containing gas. Maintaining the chamber temperature high enough to activate the scavenging gas, but low enough to encourage deposition of the reaction products on the chamber surfaces, such as between about 600° C. and about 800° C., also enhances formation of the deposition resistant film. Chamber temperature may be maintained by heating the substrate support, in some embodiments.

Alternately, at 314, a deposition resistant film may be deposited using a PVD process. Chamber components to be coated with the resistant film are disposed in a PVD chamber, and a coating is sputtered onto the components. Materials such as those described above may be sputter coated onto the chamber components. Alternately, resistant metals, such as tungsten, chromium, molybdenum, or combinations or alloys thereof, may be sputter coated.

A heat treatment operation may be advantageously performed at any stage of the processes of FIGS. 2 and 3. A heat treatment process may comprise setting an internal temperature of the chamber between about 800° C. and about 1,200° C. at a pressure between about 5 Torr and about 300 Torr for a duration of about 30 seconds to 10 minutes, such as a duration of about 60 seconds to 5 minutes. The heat treatment may have different effects when performed at different stages, but is generally used to densify and/or harden coatings and seasoning layers and to volatilize surface-adhered species.

In some embodiments, prior to performing a deposition process, it may be beneficial to pre-coat chamber internal surfaces, including the gas distributor, with a stabilizing layer without performing a cleaning operation. Coating with a stabilizing layer may be faster than a full cleaning operation, and may allow processing to continue without performing the entire cleaning operation. A stabilizing layer may have similar composition to layers that may be deposited on a substrate in the chamber to minimize the possibility of contaminating such substrates with foreign material. A stabilizing layer may be formed by flowing a metal organic precursor such as TMS, TMA, TMG, and/or TMI and a reducing reagent, such as $NH_3$ and/or $H_2$ into the chamber and activating the gas mixture, according to process conditions described above. A silicon carbide stabilizing layer may also be formed from a mixture of silane and methane. A stabilizing layer having a thickness between about 0.2 μm and about 2.0 μm will stabilize any deposits that may remain on chamber surfaces from prior processes.

The processes of cleaning, coating, seasoning, baking, and stabilizing may be performed in any advantageous combination with respect to deposition processes. In one embodiment, after each deposition process, cleaning, coating, seasoning, and stabilizing are performed prior to the next deposition process. In another embodiment, baking and stabilizing, or just stabilizing, are performed after each deposition process, while cleaning, coating, and seasoning are performed after a plurality of deposition processes. In another embodiment, N deposition processes are performed between stabilizing operations, and M stabilizing cycles are performed between cleaning and seasoning operations, with N being 1-20 deposition processes, and M being 0-5 stabilization cycles. Thickness of the stabilization layer may be adjusted based on number of deposition cycles between stabilization operations. For example, a thicker stabilization layer may be formed after a high number of sequential deposition processes.

Stabilizing may be accomplished in some embodiments by soaking the chamber in an atmosphere comprising the metal organic compound to be used in a subsequent deposition process. For example, before depositing a gallium containing layer, a gas comprising TMG, optionally with an inert carrier gas such as nitrogen or hydrogen, may be provided to the chamber for a soak period of about 30 seconds to about 30 minutes, for example about 10 minutes. Soaking is generally performed at a chamber pressure between about 10 Torr and about 300 Torr at temperatures ranging from about 20° C. to about 1,000° C. Deposition may then begin by adding a deposition precursor such as ammonia to the gas mixture in the chamber. Similar stabilizing may be performed prior to deposition of aluminum, silicon, and indium layers by soaking in TMA, TMS, and TMI, respectively. Prior to deposition cycles in which dicyclopentadienyl magnesium ($Cp_2Mg$) is used as a p-type dopant for a multi-quantum well layer, the chamber may be advantageously soaked in $Cp_2Mg$ to accomplish stabilization. Stabilizing with a soak process may be performed in addition to, or instead of, forming a stabilization layer.

In some embodiments, more than one film may be applied to chamber components to retard formation of deposits on chamber internal surfaces during a deposition process. For example, chamber components may be sputter coated with a resistant metal such as those described above in a PVD chamber, and then CVD coated with silicon or metal compounds. Deposits formed on such films may be stripped using processes described elsewhere herein, leaving the metal film, and perhaps portions of the CVD film, and the CVD film may be replaced following the stripping process, as described above. In other embodiments, a homogeneous film comprising two or more resistant materials, for example gallium nitride, silicon nitride, silicon carbide, or aluminum nitride doped with tungsten, chromium, molybdenum, or any combination thereof, may also be formed by adding one or more precursors comprising any of those metals to a CVD film formation process.

Apparatus

Figure 4:
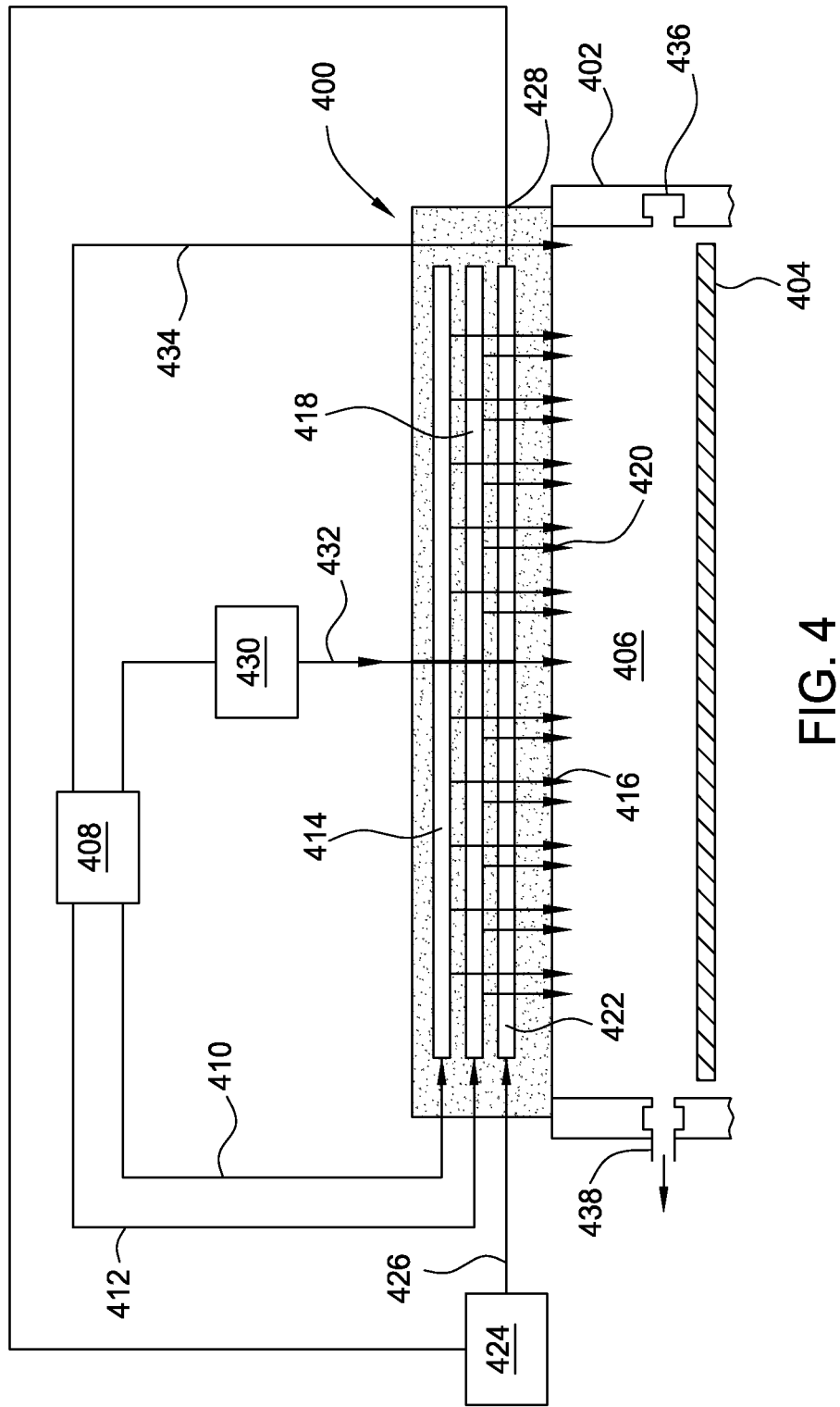
FIG. 4 is a schematic cross-sectional view of a gas distributor useful for practicing embodiments of the invention.

FIG. 4 is a schematic cross-sectional view of a gas distributor 400 that may be used in a MOCVD or HVPE deposition chamber, and may be useful for practicing embodiments described herein. The gas distributor 400 is shown in proximity to a chamber wall 402 and a substrate support 404. In operation, a substrate is generally disposed on the substrate support 404, and gases are provided to a processing region 406 defined by the substrate support 404, the chamber wall 402, and the gas distributor 400.

The gases are provided through the gas distributor 400 by a chemical delivery module 408 via a plurality of pathways. A first pathway 410 and a second pathway 412 are in communication with the chemical delivery module 408. The first pathway 410 delivers a first precursor or gas mixture to the processing region 406 via a first conduit 414 and a first plurality of outlets 416. The second pathway 412 delivers a second precursor or gas mixture to the processing region 406 via a second conduit 418 and a second plurality of outlets 420. A thermal control channel 422 is coupled to a heat exchanging system 424 via a thermal control pathway 426. A thermal control fluid flows from the heat exchanging system 424 through the thermal control pathway 426, through the thermal control channel 422, and exits through an exit portal 428, from which the thermal control fluid may be returned to the heat exchanging system 424, if desired. Process gases generally exit the chamber through an exhaust channel 436 that communicates with one or more exhaust ports 438, which communicate with a vacuum system (not shown).

In some embodiments, a central pathway 432 is provided through the gas distributor 400 for use with a remote plasma source 430. The remote plasma source 430 receives precursors from the chemical delivery module 408, activates them by forming a plasma in the remote plasma source 430, and provides the activated species to the processing region 406 via the central pathway 432. The central pathway 432 may also be used, in some embodiments, to provide gases that have not been activated to the processing region 406. In some embodiments, a cleaning gas or precursor may be provided directly to the processing region 406 via, for example, the central pathway 432.

The gas distributor 400 of FIG. 4 has a bypass pathway 434 disposed through a peripheral region of the gas distributor 400 for supplying process gases to the processing region 406 without using the precursor pathways 414 and 418. Such bypass pathways may be useful for cleaning, seasoning, conditioning or other processes.

Figure 5A:
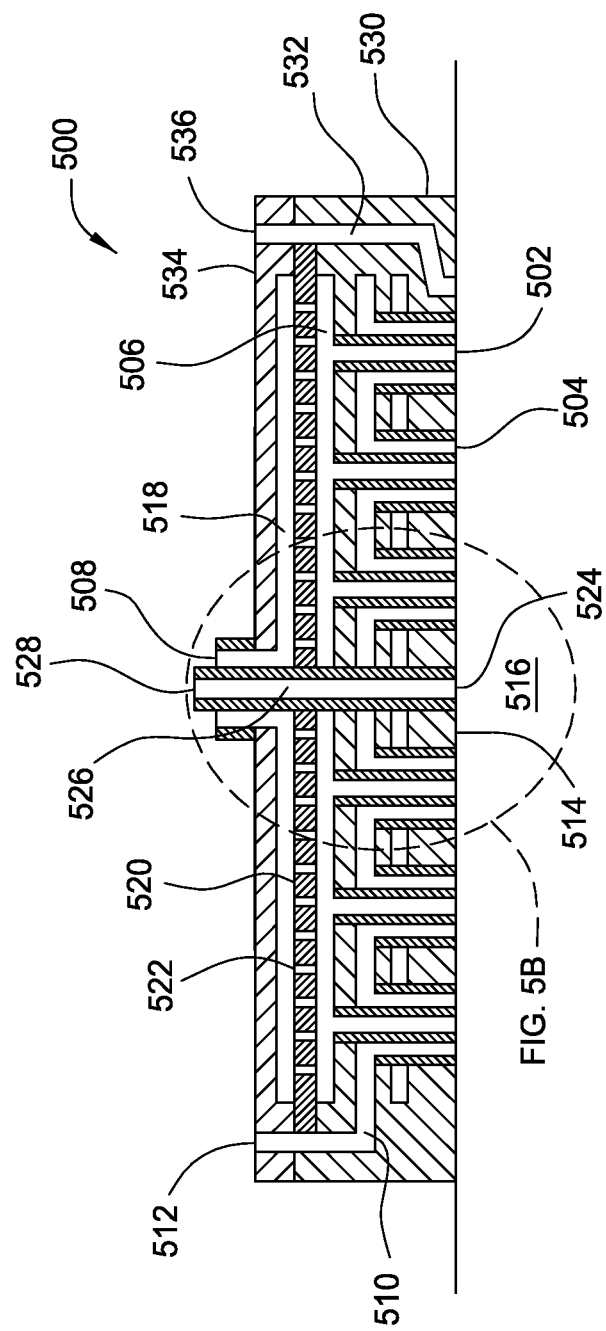
FIG. 5A is a cross-sectional view of a gas distributor according to one embodiment.

FIG. 5A is a cross-sectional view of a gas distributor 500 for a deposition chamber that may benefit from one or more processes described herein. The gas distributor 500 comprises a first plurality of openings 502 and a second plurality of openings 504, each of which surrounds one of the first plurality of openings 502, such that each opening 502 is concentrically aligned with an opening 504. The first plurality of openings 502 is in communication with a first gas pathway 506 and a first gas inlet 508, the first gas pathway comprising a plenum 518 and a blocker plate 520 having a plurality of portals 522 formed therethrough. The second plurality of openings 504 is in communication with a second gas pathway 510 and a second gas inlet 512. The first and second pluralities of openings 502 and 504 are formed in a surface 514 of the gas distributor 500 that faces a processing volume 516 adjacent to the surface 514. The first and second gas pathways 506 and 510 facilitate providing process gases to the processing volume 516 without prior mixing.

A central opening 524 in the surface 514 is in communication with a third pathway 526 and a third gas inlet 528. The third pathway 526 provides a means to flow process gases into a central portion of the processing volume 516 while bypassing the first and second plurality of openings 502 and 504, if desired. A side wall 530 and lid portion 534 of the gas distributor 500 may have one or more openings 532 formed therethrough and in communication with a fourth gas inlet 536, or a plurality thereof, for flowing process gases into the processing volume 516 while bypassing the gas distributor altogether.

FIG. 5B is a close-up view of a portion of the gas distributor 500 of FIG. 5A. A coating 538 is provided over the surface 514 of the gas distributor 500. The coating 538 of FIG. 5A is a CVD coating, as described elsewhere herein. The coating 538 covers portions of the surface 514 facing the processing volume 516, but does not penetrate the openings 502, 504, and 524.

FIG. 5C is a detail view of the region around an opening 504 of the gas distributor 500. The opening 504 has a dimension "d", defined by the distance between opposite walls of the opening 504. The coating has a thickness "t", which is generally between about 100 nm and about 200 nm. An exclusion zone "e" surrounding the opening 504 is not coated due to flow and mixing of gases exiting opening 504 during deposition. By forming the coating using gas flow rates substantially similar to those used when depositing a layer on a substrate, the coated area of the gas distributor substantially matches the area that receives deposits when processing a substrate, so the exclusion zone "e" is sized such that metal nitride deposits do not form in the exclusion zone "e". In one embodiment, the exclusion zone "e" has a dimension that is less than about 50% of the opening dimension "d". The coating 538 tapers in thickness approaching the exclusion zone "e". The distance over which the coating 538 tapers is typically between about 10% and about 20% of the dimension "d" of the opening 504, such that the average taper angle α is between about 0° and about 5°, depending on the thickness "t".

In one embodiment, the coating may comprise more than one deposited layer. For example, a tungsten film may be deposited first on the gas distributor 500, followed by a CVD film of the kind described above (i.e., silicon nitride, silicon carbide, gallium nitride, aluminum nitride). In another embodiment, a tungsten-doped CVD film may be formed on the gas distributor 500 to improve the resistance of the film to deposition products. In a CVD process to form a film of one of the compounds listed above, a tungsten precursor may be provided to the chamber with the other precursors to add tungsten to the deposited film. In another embodiment, a tungsten-doped CVD film may be formed over a tungsten film deposited by PVD or CVD processes known in the art. In each of these embodiments, chromium or molybdenum may be used in place of, or in addition to, tungsten.

The coating 538 may be heat treated to improve its hardness, smoothness, or inertness to deposition. Additionally, a bilayer or multilayer film may be heat treated to improve adhesion of the various layers together. A heat treatment such as that described above will generally suffice to harden the film to process conditions.

In operation, a first precursor is provided to the processing volume 516 through the first gas pathway 506, and a second precursor is provided to the processing volume 516 through the second gas pathway 510. The first precursor may comprise a group III material such as gallium, aluminum, or indium. The group III material may be a metal organic precursor such as trimethyl gallium (TMG), trimethyl aluminum (TMA), or trimethyl indium (TMI), or other metal organic compound. The second precursor is typically a nitrogen containing precursor, such as ammonia. The first and second precursors mix upon exiting the gas distributor, and react to form a group III nitride layer on the substrate, which is generally disposed on a substrate support arranged facing the gas distributor, as in the substrate support 404 of FIG. 4. A carrier gas such as nitrogen, hydrogen, argon, or helium, may be provided with the first or second precursors, and the first and second precursors may be blends of multiple components. For example, the first precursor may be a mixture of TMG, TMA, and/or TMI, and the second precursor may be a mixture of ammonia and other nitrogen compounds, such as hydrazine or a lower amine.

Sacrificial Coating

In one embodiment, the coating applied to the gas distributors of FIGS. 5A-5B may be a sacrificial layer comprising silicon, aluminum, or both. A layer comprising nitrides of silicon and/or aluminum may be formed on a surface of the gas distributor facing the processing environment. During the cleaning operations described above to remove metal nitride deposits formed on the sacrificial layer, the active halogen gas etches the sacrificial layer faster than the deposits are converted or removed, removing the sacrificial layer behind the deposit layer, and exposing more surface area of the deposit layer to the halogen gas, increasing the rate of reaction with the halogen gas. The sacrificial layer may be an aluminum nitride layer, a silicon nitride layer, or a mixture thereof. In some embodiments, the sacrificial layer may be a bilayer of, for example, silicon and silicon nitride or aluminum and aluminum nitride. In some embodiment, after performing a cleaning process (e.g., FIG. 3, at 302), which removes the prior deposited sacrificial layer and other chamber deposits, a new sacrificial layer is deposited on the surface of the chamber components before a device formation layer (e.g., one or more group III layers) is deposited on one or more substrates in the processing chamber.

The sacrificial layer may be formed in a CVD process by providing a silicon or aluminum precursor, or both, such as TMS, silane or TMA, to the chamber to form the sacrificial layer on the chamber components. In one embodiment, a silicon or aluminum precursor and a nitrogen containing gas, such as any of those described above, are provided to the processing region of the processing chamber. In one embodiment, ammonia is used as the nitrogen containing gas. A carrier gas such as hydrogen or argon may be provided with both the precursor gas mixture and the nitrogen containing gas. Chamber temperature is generally maintained above 1,000° C., for example between about 1,100° C. and about 1,200° C., during formation of the sacrificial layer, and chamber pressure is maintained between about 100 Torr and about 200 Torr.

In one embodiment, a mixture of ammonia and hydrogen is flowed into the chamber at about 60 sLm. The ammonia flow rate may be between about 5 sLm and about 30 sLm, for example about 25 sLm. The flow of the ammonia/hydrogen mixture may be established by starting flow of the hydrogen gas and then flowing the ammonia gas into the hydrogen carrier gas. Chamber temperature and pressure are established as described above, and flow of a precursor mixture comprising TMA and hydrogen is started. Flow rate of the precursor mixture is generally close to the flow rate of the ammonia/hydrogen mixture, about 60 sLm, with TMA flow between about 0 sLm and about 20 sLm, for example about 15 sLm. The streams mix and react, depositing a layer of aluminum nitride on the gas distributor. Maintaining the reaction for a duration of between about 10 minutes and about 30 minutes will deposit a layer having a thickness between about 100 nm and about 200 nm on the gas distributor.

In another embodiment, the sacrificial layer may include a layer of metal nitride, for example gallium nitride. The flow of the silicon or aluminum precursor is generally replaced with a metal precursor as the reaction continues, and deposition of silicon or aluminum transitions to deposition of metal. In one embodiment, flow of TMA is replaced with flow of TMG at the same flow rate to deposit a thin layer of gallium nitride over a layer of aluminum nitride. In another embodiment, the sacrificial layer may comprise three layers, for example a layer of aluminum, a layer of aluminum nitride, and a layer of gallium nitride.

At the conditions described above, the coating of gallium nitride, or other metal nitride (indium, etc.), doped or undoped, is a low quality layer, rich in metal and having a morphology that comprises a metal matrix with metal nitride domains. The metal nitride domains will also typically have nitrogen vacancies. The structure of the layer reduces affinity for deposition of metal nitrides on the layer.

In all the embodiments of deposition and cleaning described above, it should be noted that operations depending on interaction of process gases with the gas distributor may be enhanced by flowing one or more process gases through a gas inlet that bypasses the gas distributor. For example, in the embodiment of FIG. 5A, the opening 532 formed through the sidewall 530 of the gas distributor 500 may be beneficially used to route a halogen gas for a cleaning operation, a purge gas for a purge operation, or a nitrogen containing gas for a scavenging or deposition operation. Flowing one or more gases through a bypass pathway directs the process gases into more intimate contact with the surface of the gas distributor.

The foregoing description describes embodiments wherein internal surfaces of a chamber are cleaned, and one or more films are optionally deposited on internal surfaces of a processing chamber by feeding CVD precursors through the gas distribution assembly of the chamber. It should be noted that alternate embodiments may feed precursors through one or more portals in sidewalls of the chamber, or through one or more portals in the bottom of the chamber, or any combination of feed through the gas distributor, sidewalls, and bottom of the chamber. Feeding precursor and/or cleaning gases through the sidewalls and bottom of the chamber may enhance exposure of chamber internal surfaces to the reactive components of the precursors by altering gas flow patterns through the chamber.

While the foregoing is directed to embodiments of the invention, other and further embodiments of the invention may be devised without departing from the basic scope thereof.

What is claimed is:

1. A method of cleaning group III nitride deposits from a chamber component of a processing chamber, comprising:
   forming a sacrificial layer on the chamber component prior to depositing group III nitrides;
   treating the sacrificial layer and group III nitrides formed on the sacrificial layer to cause conversion of the group III nitrides to group III halides, using a first gas mixture comprising chlorine gas ($Cl_2$) in a carrier gas at a concentration between about 50% and about 80% to the processing chamber at a temperature between about 650° C. and about 750° C. while maintaining a pressure of the processing chamber between about 100 Torr and about 200 Torr;
   discontinuing the chlorine gas ($Cl_2$) while maintaining the carrier gas, reducing the pressure to about 50 Torr or below, and increasing the chamber temperature to at least about 1,000° C. to cause evaporation or sublimation of the group III halides;
   providing a second gas mixture comprising ammonia ($NH_3$) to the processing chamber at a temperature between about 900° C. and about 1,100° C. for purging residues of the group III halides from the processing chamber while maintaining the pressure of the processing chamber between about 100 Torr and about 200 Torr; and
   repeating, at least one time, providing the first gas mixture to the processing chamber, discontinuing the chlorine gas ($Cl_2$), and providing the second gas mixture to the processing chamber.

2. The method of claim 1, wherein the sacrificial layer is formed using a chemical vapor deposition (CVD) process including providing a precursor mixture comprising silicon, aluminum, or both along with a nitrogen containing gas to the processing chamber and maintaining the chamber temperature above 1000° C. and pressure between about 100 Torr and about 200 Torr.

3. The method of claim 2, wherein the CVD process further comprises providing a carrier gas of hydrogen or argon along with the precursor mixture and the nitrogen containing gas to the processing chamber.

4. A method of cleaning group III deposits from a chamber component of a processing chamber, comprising:
- forming a sacrificial layer on the chamber component prior to depositing group III deposits, wherein the sacrificial layer is formed using a chemical vapor deposition (CVD) process comprising:
  - providing a precursor mixture comprising silicon, aluminum, or both along with a nitrogen containing gas and a carrier gas of hydrogen or argon to the processing chamber;
  - maintaining the chamber temperature above 1000° C. and pressure between about 100 Torr and about 200 Torr;
  - providing a carrier gas of hydrogen or argon along with the precursor mixture and the nitrogen containing gas to the processing chamber; and
  - discontinuing the silicon, aluminum, or both precursor mixture and providing a metal precursor mixture comprising gallium or other group III metal at a flow rate at about the same rate as the precursor mixture;
- treating the sacrificial layer and group III formed on the sacrificial layer using a first gas mixture comprising chlorine gas ($Cl_2$) in a carrier gas at a concentration between about 50% and about 80% to the processing chamber at a temperature between about 650° C. and about 750° C. while maintaining a pressure of the processing chamber between about 100 Torr and about 200 Torr;
- discontinuing the chlorine gas ($Cl_2$) while maintaining the carrier gas, reducing the pressure to about 50 Torr or below, and increasing the chamber temperature to at least about 1,000° C.;
- providing a second gas mixture comprising ammonia ($NH_3$) in the carrier gas to the processing chamber at a temperature between about 900° C. and about 1,100° C. while maintaining the pressure of the processing chamber between about 100 Torr and about 200 Torr; and
- repeating, at least one time, providing the first gas mixture to the processing chamber, discontinuing the chlorine gas ($Cl_2$), and providing the second gas mixture to the processing chamber.

5. A method of cleaning group III deposits from a chamber component of a processing chamber, comprising:
- forming a sacrificial layer on the chamber component prior to depositing group III deposits, using a chemical vapor deposition (CVD) process including reacting a mixture of ammonia and hydrogen flowed into the processing chamber at flow rate of about 60 standard liter per minute (slm) with a precursor mixture of trimethyl aluminum (TMA) and hydrogen flowed into the processing chamber at flow rate of about 60 (slm), and maintaining the reaction for a duration of between about 10 minutes and about 30 minutes with the chamber temperature above 1000° C. and pressure between about 100 Torr and about 200 Torr;
- treating the sacrificial layer and group III formed on the sacrificial layer using a first gas mixture comprising chlorine gas ($Cl_2$) in a carrier gas at a concentration between about 50% and about 80% to the processing chamber at a temperature between about 650° C. and about 750° C. while maintaining a pressure of the processing chamber between about 100 Torr and about 200 Torr;
- discontinuing the chlorine gas ($Cl_2$) while maintaining the carrier gas, reducing the pressure to about 50 Torr or below, and increasing the chamber temperature to at least about 1,000° C.;
- providing a second gas mixture comprising ammonia ($NH_3$) in the carrier gas to the processing chamber at a temperature between about 900° C. and about 1,100° C. while maintaining the pressure of the processing chamber between about 100 Torr and about 200 Torr; and
- repeating, at least one time, providing the first gas mixture to the processing chamber, discontinuing the chlorine gas ($Cl_2$), and providing the second gas mixture to the processing chamber.

6. A method of cleaning group III deposits from a chamber component of a processing chamber, comprising:
- forming a sacrificial layer on the chamber component prior to depositing group III deposits;
- treating the sacrificial layer and group III formed on the sacrificial layer using a first gas mixture comprising chlorine gas ($Cl_2$) in a carrier gas at a concentration between about 50% and about 80% to the processing chamber at a temperature between about 650° C. and about 750° C. while maintaining a pressure of the processing chamber between about 100 Torr and about 200 Torr;
- discontinuing the chlorine gas ($Cl_2$) while maintaining the carrier gas, reducing the pressure to about 50 Torr or below, and increasing the chamber temperature to at least about 1,000° C.;
- providing a second gas mixture comprising ammonia ($NH_3$) in the carrier gas to the processing chamber at a temperature between about 900° C. and about 1,100° C. while maintaining the pressure of the processing chamber between about 100 Torr and about 200 Torr; and
- forming a deposition resistant film by adding a metal or silicon containing gas to the second gas mixture and maintaining activation of the second gas mixture with a temperature between about 600° C. and about 800° C.

7. The method of claim 6, wherein the deposition resistant film is p-doped or n-doped.

* * * * *